United States Patent
Montmeat et al.

(10) Patent No.: US 9,934,995 B2
(45) Date of Patent: Apr. 3, 2018

(54) METHOD FOR MANUFACTURING A HANDLE SUBSTRATE FOR THE TEMPORARY BONDING OF A SUBSTRATE

(71) Applicant: COMMISSARIAT À L'ENERGIE ATOMIQUE ET AUX ENERGIES ALTERNATIVES, Paris (FR)

(72) Inventors: Pierre Montmeat, Froges (FR); Laurent Bally, Saint-Georges-de-Commiers (FR); Frank Fournel, Villard-Bonnot (FR); Michel Pellat, Grenoble (FR)

(73) Assignee: COMMISSARIAT À L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 0 days.

(21) Appl. No.: 15/105,847

(22) PCT Filed: Dec. 15, 2014

(86) PCT No.: PCT/FR2014/053354
§ 371 (c)(1),
(2) Date: Jun. 17, 2016

(87) PCT Pub. No.: WO2015/092254
PCT Pub. Date: Jun. 25, 2015

(65) Prior Publication Data
US 2017/0025301 A1    Jan. 26, 2017

(30) Foreign Application Priority Data
Dec. 17, 2013 (FR) .................... 13 62845

(51) Int. Cl.
*H01L 21/683* (2006.01)
*H01L 21/78* (2006.01)
(Continued)

(52) U.S. Cl.
CPC ...... *H01L 21/6835* (2013.01); *H01L 21/7813* (2013.01); *H01L 2221/68318* (2013.01);
(Continued)

(58) Field of Classification Search
None
See application file for complete search history.

(56) References Cited

U.S. PATENT DOCUMENTS 6,117,778 A * 9/2000 Jones ............... H01L 21/31053
257/E21.244
2006/0292887 A1    12/2006 Hara
(Continued)

FOREIGN PATENT DOCUMENTS

WO    2013/006865 A2    1/2013

OTHER PUBLICATIONS

Mar. 3, 2015 International Search Report issued in International Patent Application No. PCT/FR2014/053354.
(Continued)

*Primary Examiner* — Jiong-Ping Lu
(74) *Attorney, Agent, or Firm* — Oliff PLC

(57) ABSTRACT

This process includes steps: a) providing a carrier substrate including a receiving face; b) depositing a nonstick coating on the receiving face, the nonstick coating including a central region and a peripheral region; and c) trimming the carrier substrate so as to remove the peripheral region of the nonstick coating and to form a recess on the periphery of the carrier substrate, in order to obtain the handle wafer. Also relates to a process for temporarily bonding a substrate to a handle wafer fabricated using the process described above. Furthermore relates to a handle wafer fabricated using the process described above.

15 Claims, 1 Drawing Sheet

(52) U.S. Cl.
CPC ............... *H01L 2221/68327* (2013.01); *H01L 2221/68381* (2013.01)

(56) References Cited

U.S. PATENT DOCUMENTS

| | | |
|---|---|---|
| 2011/0069467 A1 | 3/2011 | Flaim et al. |
| 2012/0038060 A1 | 2/2012 | Cheng |
| 2013/0248099 A1* | 9/2013 | Shimizu .............. H01L 21/6835 156/247 |

OTHER PUBLICATIONS

Jun. 21, 2016 International Preliminary Report on Patentability issued in International Patent Application No. PCT/FR2014/053354.

S.M. Wiederhorn et al. "Critical Analysis of the Theory of the Double Cantilever Method of Measuring Fracture-Surface Energies". Journal of Applied Physics, vol. 39, No. 3, Feb. 15, 1968, pp. 1569-1572.

Örjan Vallin et al. "Adhesion Quantification Methods for Wafer Bonding". Materials Science and Engineering Reports, vol. 50, Issues 4-5, Dec. 30, 2005, pp. 109-165.

\* cited by examiner a)

METHOD FOR MANUFACTURING A HANDLE SUBSTRATE FOR THE TEMPORARY BONDING OF A SUBSTRATE

The present invention concerns a method for manufacturing a handle substrate for the temporary bonding of a substrate in particular for applications in the fields of electronics, optics or optoelectronics. The invention also concerns a method for temporarily bonding a substrate to the handle substrate and it further concerns a handle substrate for the temporary bonding of a substrate, as obtained by this manufacturing method.

Recent advances in microelectronics require forming and handling ultra thin substrates, whose thickness may in particular be comprised between 50 and 150 micrometers. Indeed, these ultra thin substrates are difficult to handle on the production lines and with the conventionally used standard tools. In addition, according to the nature of the materials constituting these ultra thin substrates, the latter are sometimes so flexible that they wind about themselves at rest, making them difficult to use. To remedy this, a temporary bonding technique allows maintaining it in place on a carrier substrate by means of an adhesive polymer layer. It is then possible to handle the stack formed with standard tools and to carry out technological steps on the substrate. Once the thinning and the steps of manufacture of electronic components are carried out, the substrate is debonded from its carrier substrate. The debonding is conventionally made with a sequence of chemical and mechanical actions. More specifically, a method known under the denomination Zone Bond® technology proposes a temporary bonding from a carrier substrate prepared according to the following steps:

1—Depositing a resin in the peripheral area of a carrier substrate, for example made of silicon or glass, over a width from 15 to 50 mm, 2—Depositing a generally fluorinated anti-adhesive compound on the central portion of the carrier substrate, 3—Drying and rinsing the anti-adhesive compound, 4—Gumming the resin at the peripheral area with an adapted solvent, and 5. Drying the carrier substrate.

A carrier substrate which has an anti-adhesive area at the center and an untreated silicon (or glass) ring on a peripheral area is thus obtained. This ring ensures then adhesion during the bonding with the substrate on which an adhesive has been spread beforehand. Once the desired treatment performed on the substrate, a chemical attack at a peripheral portion of the stack weakens the bonding. Combined with the low adhesion obtained by the presence of the anti-adhesive layer, this attack makes possible the mechanical debonding of the substrate from its carrier.

A known variant to this method consists in carrying out the following steps:

1—Depositing an adhesive component on the peripheral portion of a carrier substrate, 2—Drying the adhesive, 3—Depositing an anti-adhesive component on the central portion of the carrier substrate, and 4—Drying and rinsing the anti-adhesive component.

The resulting carrier substrate has an anti-adhesive area at the center and an adhesive ring on a peripheral area so that it is not necessary to spread an adhesive component on the substrate.

A second variant of the method may be considered with the following steps:

1—Depositing an anti-adhesive component on a carrier substrate,

2—Drying and rinsing the anti-adhesive component,

3—The peripheral portion of the anti-adhesive component is removed by a chemical attack using a solvent of the anti-adhesive, 4—Drying the carrier substrate, 5—Depositing an adhesive component on the peripheral portion of the carrier substrate, and 6—Drying the adhesive component.

A carrier substrate having an anti-adhesive central area, an adhesive ring on a peripheral area is then obtained for a bonding with a substrate.

However, these steps are long and detailed to be carried out. Indeed, the quality of the bonding and then the quality of the debonding depend on the accuracy and homogeneity of dimensions of the peripheral ring formed along the perimeter of the carrier substrate. Furthermore, contacting the substrate and the carrier substrate via an adhesive layer leads to the formation of an adhesive bead at the periphery of the stack which prevents reaching a good flatness of the adhesive material and modifies the homogeneity of the bonding.

The present invention aims to overcome at least one of the aforementioned drawbacks. It proposes for this purpose a method for manufacturing a handle substrate for the temporary bonding of a substrate, the method comprising the steps which consist in:

a) Providing a carrier substrate comprising a receiving face, b) Depositing an anti-adhesive layer on the receiving face, the anti-adhesive layer comprising a central region and a peripheral region, and c) Trimming the carrier substrate so as to remove the peripheral region from the anti-adhesive layer and to form a recess at the periphery of the carrier substrate, in order to obtain the handle substrate.

Thus, this method allows forming a non-adhesive central portion on the carrier substrate and a trimmed peripheral portion, allowing to receive excess adhesive during bonding with the substrate so as to improve the flatness of the interface. In addition, this method is simple to implement and avoids carrying out a large number of preparation steps.

The recess formed can have different shape types, such as a step-shaped profile, a bevel or a concave curvilinear shape.

It is understood in the present document that the term "recess" is distinguished from the edge fall or from the chamfer typically achieved during the finishing of a substrate in order to facilitate its handling without generating particles contaminating clean rooms. This edge fall is in particular illustrated in a convex curvilinear shape for reasons of simplification and scale difference between the dimension of the chamfer and the dimensions of the chamfered substrate. Thus it differs from the recess according to the present invention generally performed in an angle/direction falling within the volume of the substrate.

Advantageously, the carrier substrate is massive. It is thus less fragile to handle compared to a substrate including a stack of layers and it has a volume with homogeneous chemical properties in particular towards etching reagents which may be used subsequently.

The evaluation of the adhesive or anti-adhesive character of a layer is performed by the method of the imposed displacement double lever, also known by the expression «Double Cantilever Beam test method» or its acronym «DCB» (refer to 'Critical Analysis of the Theory of the Double Cantilever Method of Measuring Fracture-Surface Energies' of S. M Wiederhorn, A M Shorb, R L Moses, Journal of Applied Physics 39 (3), 1569-1572 or to «Adhesion quantification methods for wafer bonding» O. Vallin' K. Jonsson, U. Lindberg Materials Science and Engineering: R: Reports, Volume 50, Issues 4-5, 30 Dec. 2005, Pages 109-165).

In the present document, the measurements of the adhesive/anti-adhesive character of a material have been performed by inserting a layer of said material between two silicon substrates. When the adhesion energy between these two silicon substrates assembled through this layer is greater than 1 J/m$^2$ or even greater than 1.5 or even greater than 2 J/m$^2$ then it is a layer of an adhesive material.

The anti-adhesive character of a material is measured, by inserting a layer of such a material in the preceding stack, to form an Si/adhesive/anti-adhesive/Si stack. The adhesion energy is then measured by the same method. The layer in question is considered as anti-adhesive when the measured adhesion energy is less than 900 mJ/m$^2$ and advantageously less than 800 or even less than 500 mJ/m$^2$.

Furthermore, the dismantling of the substrate temporarily bonded to the handle substrate according to the method of the present document is all the easier when the difference in adhesion energy between the adhesive and the anti-adhesive is greater than 100 mJ/cm$^2$ and advantageously greater than 500 mJ/m$^2$, even higher than 1 J/m$^2$.

Preferably, the recess formed in step c) consists in removing material from the periphery of the carrier substrate and from the peripheral region of the anti-adhesive layer so that the width L of the recess, measured from the periphery to the carrier substrate center, is substantially constant.

In the document, «substantially constant» means that the width L varies by at most 10 micrometers along the peripheral perimeter of the carrier substrate. In other words, the recess is made very accurately to meet the expected value of width L to within 10 micrometers.

According to one possibility, the recess formed in step c) has a height H comprised between 1 and 50 micrometers and a width L comprised between 1 to 50 mm. The height H is measured in a direction substantially perpendicular to the plane of the receiving face and the width L is measured in a radial direction. This height range H allows receiving excess adhesive and this width range L ensures an optimal bonding energy both for carrying out treatments on the substrate and for ensuring an easy and quality debonding.

Preferably, the material removal is carried out so that the width L varies by at most 1 micrometer (the value of the expected width L is obtained within 1 micrometer). The homogeneity of the obtained width L guarantees a uniform subsequent bonding with the substrate, which then facilitates the debonding by chemical attack or by applying a mechanical stress to the bonding interface between the substrate and the handle substrate.

According to one possibility, the recess formed in step c) has a bottom whose roughness is comprised between 1 and 500 nanometer(s) RMS (Root Mean Square) and preferably between 1 and 100 nanometer(s) RMS. This roughness is particularly favorable for bonding with the substrate. All RMS roughnesses described in this document are determined by atomic force microscopy AFM over a field of 20×20 micrometers.

According to one possibility, the trimming of step c) is carried out by means of machining tools, such as a trimming saw or a lapper. This method is inexpensive and allows obtaining a high homogeneity in the removal of peripheral material. The width L of the trimming is obtained with a variation of only 10 microns and the height H with a variation of only 1 to 2 microns (in other words, the expected value of the height H is obtained to within 1 or 2 micron(s)).

According to another possibility, the trimming of step c) is carried out by a photolithography step followed by an ion etching or chemical etching step. This method allows an accuracy of the homogeneity of the dimensions of the width L and height H of less than 1 micrometer.

According to yet another variant, the trimming of step c) is carried out by a step of implantation of ionic species, such as hydrogen, through the peripheral region of the anti-adhesive layer followed by a step of thermal exfoliation treatment. Again, this method is very accurate since it allows obtaining a variation of the width L and height H of less than a micrometer.

Advantageously, the anti-adhesive material is an organo silane fluorinated or not such as Octadecyl TrichloroSilane (OTS) or a polymer fluorinated or not such as 2702 Electronic Grade Coating polymer (supplied by 3M™). For example, the adhesion energy of these anti-adhesives measured by the DCB method is of 60 mJ/m$^2$ for the OTS and 200 mJ/m$^2$ for the 2702 polymer (Case where the adhesive is the ZoneBond® 51.50 compound).

Preferably, the carrier substrate comprises a material selected from silicon, silica, glass, sapphire, germanium or a metal. This large choice of carrier substrate allows adapting the method according to the thermal expansion coefficient with respect to that of the substrate, the thermal and mechanical resistance necessary for the rest of the method.

According to a second aspect, the present invention concerns also a method for temporarily bonding a substrate to a handle substrate, comprising the steps consisting in:

d) Providing the handle substrate manufactured as described above, e) Providing the substrate comprising a rear face and a front face, the front face being intended to receive electronic components, f) Depositing an adhesive layer on the rear face of the substrate, and/or on the face of the handle substrate including the recess, and g) Contacting the rear face of the substrate and the face of the handle substrate including the recess via the adhesive layer so as to obtain the temporary bonding of the substrate to the handle substrate.

This method allows preparing in parallel the carrier substrate and the substrate to be bonded so as to optimize the duration of the method. Contacting the substrate with the handle substrate allows the adhesive layer to be spread on the anti-adhesive layer and the surplus to fill the recess until it reaches the bottom of the recess whose roughness is optimal for the bonding. This method allows creating an interface region with low bonding energy at the central region of anti-adhesive layer and with high bonding energy at the recess. In the present document, the term 'electronic components' means complex components such as CMOS, memories, as well as simple components such as electrical interconnection. The electronic components can be made by microelectronic methods including, but not limited to, etching, depositing, cleaning steps or the like.

Advantageously, the substrate comprises a material selected from silicon, silica, glass, sapphire, germanium or a metal such as molybdenum, tungsten and copper, for example.

The latter may already have undergone steps of prior preparations on the rear face intended to be bonded, or on the front face, such as the formation of patterns (patterning).

According to one disposition, the adhesive layer comprises a material selected from HT1010 or ZoneBond® 51.50 or even WaferBOND® CR-200, provided by Brewer Science. For example, the adhesive energy provided by the ZoneBond® 51.50 adhesive measured by the previously described DCB method, can reach 2 J/m².

Advantageously, the method comprises, subsequently to step g), a step h) consisting in applying to the front face of the substrate at least one treatment step intended to the manufacture of electronic components, such as grinding, thinning, chemical-mechanical polishing, etching, dielectric or metal deposition, patterning, passivation, thermal treatment, or a combination of at least one of these treatments. Indeed, the temporary bonding of the substrate to the handle substrate allows fixing and holding the substrate in place for carrying out steps of manufacture of components.

Preferably, the method comprises, subsequently to step g), a step i) consisting in operating a chemical attack and/or applying a mechanical stress so as to separate the substrate from the handle substrate.

The mechanical stress can consist in the application of a blade at the interface between the handle substrate and the substrate, of a tensile force or of a shearing force. It can be applied for example by imposing a curvature to the assembly formed of the substrate and the handle substrate, for example by drawing on an adapted preform.

According to one possibility, the step g) further consists in applying a thermal treatment under vacuum with a compression, for example of 6 kN, at the stack formed by the substrate bonded to the handle substrate.

Preferably, the method comprises, subsequently to step i), a step j) consisting in cleaning the handle substrate to remove the residue of adhesive so that the handle substrate may be reused in step d). Indeed, this cleaning performed in particular by successive rinsing in an isopropanol solution and in a limonene solution allows removing the adhesive layer portion transferred on the handle substrate during the bonding. Thus, at the end of the cleaning, a handle substrate as provided in step c) of the method is recovered.

Advantageously, the method comprises a step k) carried out subsequently to step j) consisting in repeating at least once steps d) to i) allowing to recycle the handle substrate for the temporary bonding of a new substrate.

According to a third aspect, the invention concerns a handle substrate for the temporary bonding of a substrate, the handle substrate comprising a carrier substrate whose periphery has a recess delimiting a central portion of the carrier substrate which is covered with an anti-adhesive layer, the recess being free of anti-adhesive layer.

Preferably, the recess has a width L, measured from the periphery to the center of the carrier substrate, comprised between 1 to 50 mm, the width L varying by at most 1 micrometer along the peripheral perimeter of the carrier substrate.

Furthermore, the recess has a height H comprised between 1 and 50 micrometer(s) and varying by at most 1 micrometer along the peripheral perimeter of the support substrate.

The height H is measured in a direction substantially perpendicular to the plane of the carrier substrate. The height H can also be measured in a direction perpendicular to the width L of the recess.

Advantageously, the recess has a bottom whose roughness is comprised between 1 and 500 nanometer(s) RMS.

According to yet another aspect, the invention concerns a dismantlable stack comprising a handle substrate such as previously described and a substrate comprising a rear face and a front face intended to receive electronic components, the rear face of the substrate being bonded to the handle substrate and to the recess by an adhesive layer.

Other aspects, objects and advantages of the present invention will better appear upon reading the following description of two embodiments thereof, given by way of non-limiting examples and done with reference to the accompanying drawings. The figures do not necessarily respect the scale of all the represented elements so as to improve their readability. In the following description, in the interest of simplification, identical, similar or equivalent elements of the different embodiments have the same numerical references. Furthermore, all the bonding energies described in the following document are determined by the DCB method.

Figure 1:
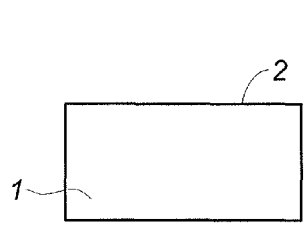
FIG. 1 illustrates a schematic sectional view of a carrier substrate for manufacturing a handle substrate according to step a) of one embodiment of the invention.

As illustrated in FIG. 1, a carrier substrate 1 comprising a receiving face 2 is provided according to step a) of the method. The material of the carrier substrate 1 is made of silicon, but it may also be made of silica, glass, sapphire, germanium or a metal such as molybdenum, tungsten and copper, according to the nature of the substrate 3 to be bonded and the desired subsequent operations.

Figure 2:
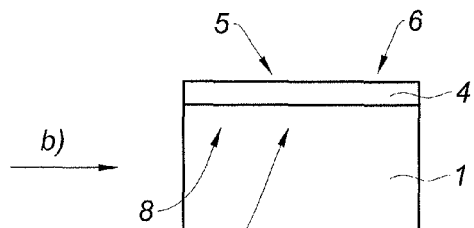
FIG. 2 illustrates a schematic sectional view of a carrier substrate covered with an anti-adhesive layer according to step b) of an embodiment of the invention.

As illustrated in FIG. 2, an anti-adhesive layer 4 is deposited on the receiving face 2 of the carrier substrate 1. The anti-adhesive layer 4 comprises a central region 5 and a peripheral region 6 respectively covering a central portion 7 and a peripheral portion 8 of the carrier substrate 1. This anti-adhesive layer 4 comprises an anti-adhesive material, such as an organo silane compound selected from the OTS provided by Sigma Aldrich. The OTS layer 4 is for example deposited by immersing the substrate 3 for 5 minutes in an OTS solution diluted in isooctane and having a concentration of $5.10^{-3}$ mol/l. An anti-adhesive layer 4 having a thickness comprised between 1 and 10 nanometer(s) is then obtained.

According to one variant, the anti-adhesive layer 4 is made of 2702 Electronic Grade coating polymer provided by 3M™ and is deposited by spin coating until obtaining an anti-adhesive layer 4 having a thickness of about 5 nanometers.

Once the anti-adhesive layer 4 is deposited, the carrier substrate 1 is air-dried for about 30 min.

Figure 3:
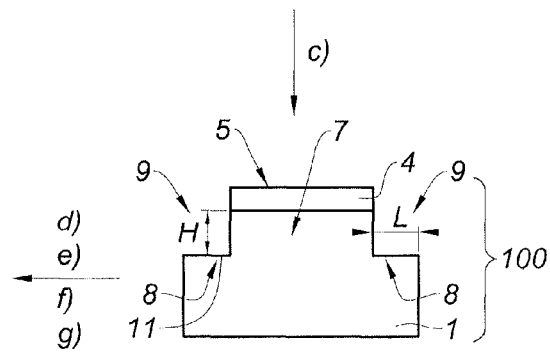
FIG. 3 illustrates a schematic sectional view of a trimmed carrier substrate according to step c) of an embodiment of the invention.

As illustrated in FIG. 3, the carrier substrate 1 is trimmed so as to remove the peripheral region 6 from the anti-adhesive layer 4 and the material from the carrier substrate 1 so as to form a recess 9 on a height H (measured in a direction substantially perpendicular to the plane of the receiving face 2) and a width L (measured in a direction of the periphery to the center of the carrier substrate (1) and oriented substantially parallel to the plane of the receiving face 2) so as to manufacture a handle substrate 100 (step c). This trimming step is carried out using a machining tool, for example a standard diamond type trimming saw (1.5 mm width, provided by DISCO) until obtaining a recess 9 of a height H of 7 micrometers (measured in a direction perpendicular to the width L) and a width L of 15 mm. Alternatively, a machining tool such as a lapper can be used.

These current microelectronic tools are simple to use and allow obtaining a high accuracy of trimming at low cost. The height H of the recess 9 is indeed constant along the peripheral perimeter of the carrier substrate 1 to within two micrometers. Similarly, the width L of the recess 9 is constant to within 10 micrometers. The resulting handle substrate 100 is formed of a carrier substrate 1 which has a recess 9 with a step-shaped profile whose dimensions are homogenous around the peripheral perimeter of the carrier substrate 1. This is in particular useful for the quality of bonding and debonding with a substrate 3.

According to one variant, the trimming of the carrier substrate 1 is carried out by a photolithography step followed by an ion etching or chemical etching step. This technique also allows improving the homogeneity of the width L and the height H of the recess 9 which are then constant to within 1 micrometer along the perimeter of the carrier substrate 1.

According to yet another non-illustrated variant, the trimming is obtained by implanting ionic species through the peripheral region 6 of the anti-adhesive layer 4 so as to create an embrittlement plane in the underlying peripheral portion 8 of the carrier substrate 1. Then, a thermal exfoliation treatment is applied so as to obtain a blistering of the material leading to the formation of the recess 9. Again, this method is very accurate and enables to respect an excellent homogeneity of the width L and the height H of the recess 9.

All these methods described above allow furthermore obtaining a recess 9 whose bottom 11 has a relatively high roughness, generally comprised between 1 and 10 nanometer(s) with the trimming saw or the photolithography followed by the ion etching, and between about 1 and 500 nanometers with the ion implantation. This roughness is favorable for obtaining subsequently a significant bonding energy during the contacting with a substrate 3.

Figure 4:
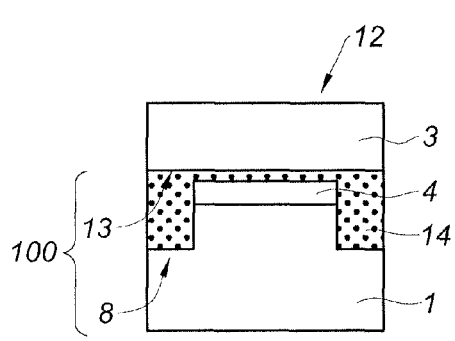
FIG. 4 illustrates a schematic sectional view of a substrate bonded to a handle substrate according to steps d) to g) of an embodiment of the invention.
Figure 5:
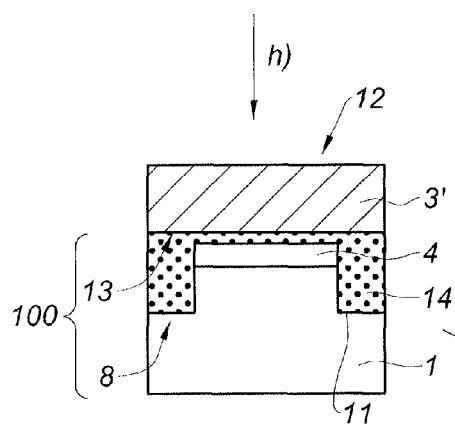
FIG. 5 illustrates a schematic sectional view of the application of a treatment to the substrate according to step h) of an embodiment of the invention.
Figure 6:
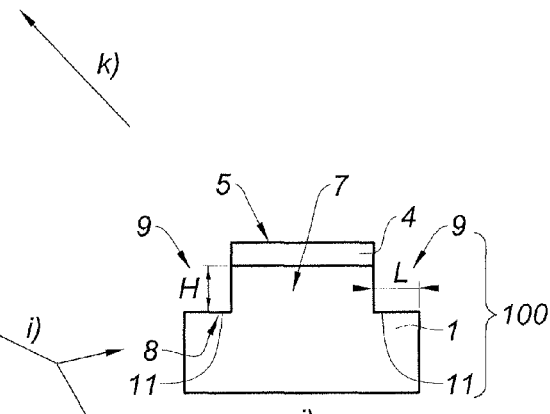
FIG. 6 illustrates a schematic sectional view of the debonding of the handle substrate and of the substrate according to step i) of an embodiment of the invention.

According to a non-illustrated variant, the trimming 9 has a profile which differs from that represented in FIGS. 4 to 6 in that its profile has a concave curvilinear shape, a bevel or the like. It is understood that the dimensions of the recess 9 remain homogeneous on the peripheral perimeter of the carrier substrate 1 for all the considered profiles.

As illustrated in FIG. 4, a substrate 3 whose front face 12 is intended to the manufacture of electronic components is brought into contact with the handle substrate 100 (step e). The substrate 3 composed of sapphire but may also be selected from silica, silicon, glass, germanium or a metal such as molybdenum, tungsten and copper. The rear face 13 of the substrate 3 was previously prepared by depositing an adhesive layer (step f). According to a non-illustrated possibility, this adhesive layer 14 could alternatively or additionally also be deposited on the face comprising the recess 9 of the handle substrate 100. This adhesive layer 14 is for example deposited by spin-coating of a ZoneBond® 51.50 adhesive (provided by Brewer Science—adhesion energy up to 2 J/m$^2$) until having a thickness between about 10 and 100 micrometers and preferably about 50 micrometers. According to a non-illustrated variant, the adhesive layer 14 could be obtained by HT1010 or WaferBOND® CR-200 deposition, provided by Brewer Science.

The thus prepared substrate 3 is dried at 90° C. for 10 min and then subjected to a thermal treatment at 200° C. for 2 min to remove the solvent from the adhesive. Finally, the rear face 13 of the substrate 3 is brought into contact with the handle substrate 100 under vacuum so that the adhesive layer 14 contacts the bottom 11 of the recess 9. The thus formed stack is subjected to a thermal treatment at about 210° C. accompanied by a compression of 6 kN applied for 4 min. The formation of an adhesive layer bead 14 at the edge of the substrate 3 is prevented by the presence of the recess 9. As a result, the flatness of the adhesive layer 14 is improved and the bonding is optimized compared to that obtained with a non trimmed handle substrate 100. At the end, a bonding of energy of about 600 mJ/m$^2$ is obtained between the handle substrate 100 and the substrate 3.

According to a non-illustrated variant, the rear face 13 and/or the front face 12 of the substrate 3 has undergone one or more prior step(s) of preparation before bonding, in view of their future applications, such as the patterning.

As illustrated in FIG. 5, the front face 12 of the substrate 3 secured to the handle substrate 100 is subjected to one or more step(s) in view of manufacturing electronic components that would be difficult achieve without temporary bonding (step h). These steps comprise for example a grinding, thinning, chemical-mechanical polishing, etching, dielectric or metal deposition, patterning, passivation or thermal treatment.

As illustrated in FIG. 6, once these steps are carried out, a mechanical stress applied by a blade to the interface between the handle substrate 100 and the substrate 3, allows obtaining the debonding of the substrate 3 (step i). Alternatively, the mechanical stress is exerted by applying a tensile and/or shearing force or by bending the assembled structure. According to yet another variant, step i) is carried out by chemical attack in addition or not to the application of a mechanical stress.

The handle substrate 100 then recovered has a portion of the adhesive layer 14 transferred on the peripheral portion 8 of the carrier substrate 1 corresponding to the width L of the recess 9. A residual adhesive layer portion 14 in the central region of the substrate 3 and corresponding to the central region 5 of the anti-adhesive layer 4 of the handle substrate 100 indicates the good adhesion obtained by the temporary bonding. The handle substrate 100 is then rinsed with limonene then rinsed with isopropanol (step j). The residual adhesive layer portion 14 in the central region of the substrate 3 can also be removed by a cleaning performed under the same conditions.

Once the adhesive layer portion 14 is removed and the handle substrate 100 is air-dried for about 5 min, the handle substrate 100 is recycled in a temporary bonding-debonding cycle with a new substrate 3 (step k).

According to one variant, the temporary bonding method according to the invention is carried out from a handle substrate 100 whose width L from the recess 9 has a dimension of about 3 mm. The obtained bonding energy at the end of step g) is of about 130 mJ/m$^2$.

Furthermore, the method of the invention carried out under the previously described conditions and from a handle substrate 100 without recess 9 leads to a bonding energy of 60 mJ/m$^2$. The trimming thus allows increasing the bonding energy in correspondence with the width L of the recess 9.

Thus, it is possible thanks to the present invention to modulate the bonding energy between the handle substrate 100 and the substrate 3 according to the width of the performed trimming. This widens the window of the methods accessible on the substrate 3 in a quick and inexpensive manner, while ensuring adequate debonding.

It goes without saying that the invention is not limited to the embodiments described above by way of examples, but it comprises all the technical equivalents and the variants of the means described as well as their combinations.

The invention claimed is:

1. A method for manufacturing a handle substrate for the temporary bonding of a substrate, wherein the method comprises:
   a) providing a carrier substrate comprising a receiving face,
   b) depositing an anti-adhesive layer on the receiving face, the anti-adhesive layer comprising a central region and a peripheral region, and
   c) trimming the carrier substrate so as to remove the peripheral region from the anti-adhesive layer and to form a recess at the periphery of the carrier substrate, in order to obtain the handle substrate, wherein
      step c) comprises removing the material from the periphery of the carrier substrate and from the peripheral region of the anti-adhesive layer so that the recess has a width, measured from the periphery to the carrier substrate center, that is substantially constant,
      the width L varies by at most 10 micrometers along the peripheral perimeter of the carrier substrate, and
      the adhesion energy of the anti-adhesive layer is less than 900 mJ/m$^2$.

2. The method according to claim 1, wherein the trimming of step c) is carried out by means of machining tools.

3. The method according to claim 1, wherein the trimming of step c) is carried out by a photolithography step followed by an ion etching or chemical etching step.

4. The method according to claim 1, wherein the trimming of step c) is carried out by a step of implantation of ionic species, through the peripheral region of the anti-adhesive layer followed by a step of thermal exfoliation treatment.

5. The method according to claim 1, wherein the carrier substrate comprises a material selected from silicon, silica, glass, sapphire, germanium or a metal.

6. The method according to claim 1, wherein the handle substrate comprises a carrier substrate whose periphery has a recess, the recess delimiting a central portion of the carrier substrate covered with an anti-adhesive layer, the recess being free of anti-adhesive layer.

7. The method according to claim 6, wherein the recess has a width, measured from the periphery to the center of the carrier substrate, comprised between 1 to 50 mm, the width varying by at most 10 micrometers along the peripheral perimeter of the carrier substrate.

8. The method to claim 6, wherein the recess has a bottom whose roughness is between 1 and 500 nanometer(s) RMS.

9. The method according to claim 1, wherein the material removal is carried out so that the width L varies by at most 1 micrometer.

10. The method for temporarily bonding a substrate to a handle substrate, wherein the method comprises:
    d) providing the handle substrate manufactured according to claim 1,
    e) providing the substrate comprising a rear face and a front face, the front face being intended to receive electronic components,
    f) depositing an adhesive layer on the rear face of the substrate and/or on the face of the handle substrate including the recess, and
    g) contacting the rear face of the substrate and the face of the handle substrate including the recess via the adhesive layer so as to obtain the temporary bonding of the substrate to the handle substrate.

11. The method according to claim 10, wherein the substrate comprises a material selected from silicon, silica, glass, sapphire, germanium or a metal.

12. The method according to claim 10, wherein the method comprises, subsequently to step g), a step h) of applying at least one treatment step to the front face of the substrate intended to the manufacture of electronic components from the following: grinding, thinning, chemical-mechanical polishing, etching, dielectric or metal deposition, patterning, passivation, thermal treatment, or a combination of at least one of these treatments.

13. The method according to claim 10, wherein the method comprises, subsequently to step g), a step i) of operating a chemical attack and/or applying a mechanical stress so as to separate the substrate from the handle substrate.

14. The method according to claim 13, wherein the method comprises, subsequently to step i), a step j) of cleaning the handle substrate to remove the residue of adhesive so that the handle substrate may be reused in step d).

15. The method according to claim 14, wherein the method comprises a step k) carried out subsequently to step j) of repeating at least once steps d) to i).

* * * * *